United States Patent
Müller

(10) Patent No.: US 11,127,877 B2
(45) Date of Patent: Sep. 21, 2021

(54) METHOD FOR PRODUCING OPTOELECTRIC SEMICONDUCTOR COMPONENTS, AND OPTOELECTRONIC SEMICONDUCTOR COMPONENT

(71) Applicant: OSRAM OLED GmbH, Regensburg (DE)

(72) Inventor: Jens Müller, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/772,740

(22) PCT Filed: Nov. 28, 2018

(86) PCT No.: PCT/EP2018/082865
§ 371 (c)(1),
(2) Date: Jun. 12, 2020

(87) PCT Pub. No.: WO2019/115234
PCT Pub. Date: Jun. 20, 2019

(65) Prior Publication Data
US 2020/0328324 A1    Oct. 15, 2020

(30) Foreign Application Priority Data
Dec. 15, 2017  (DE) ..................... 10 2017 130 131.3

(51) Int. Cl.
*H01L 33/00*   (2010.01)
*H01L 25/075*  (2006.01)

(52) U.S. Cl.
CPC ...... *H01L 33/0062* (2013.01); *H01L 25/0753* (2013.01); *H01L 33/0093* (2020.05); *H01L 33/0095* (2013.01); *H01L 2933/0058* (2013.01)

(58) Field of Classification Search
None
See application file for complete search history.

(56) References Cited

U.S. PATENT DOCUMENTS 6,319,742 B1   11/2001  Hayashi et al.
9,698,566 B1   7/2017   Takagi
(Continued)

FOREIGN PATENT DOCUMENTS

JP   H01152784 A   6/1989
JP   H0936486 A    2/1997
(Continued)

OTHER PUBLICATIONS

Wong et al., "The Integration of InxGa1-x Multiple-Quantum-Well Laser Diodes with Copper Substrates by Laser Lift-Off", Japan Society of Applied Physics, vol. 39, 2000, 3 pages.
(Continued)

*Primary Examiner* — Robert K Carpenter
(74) *Attorney, Agent, or Firm* — MH2 Technology Law Group LLP

(57) ABSTRACT

The application concerns a method of manufacturing optoelectronic semiconductor components (1) comprising the following steps:
A) Growing a semiconductor layer sequence (3) for generating radiation onto a growth substrate (2),
B) Structuring the semiconductor layer sequence (3) into emitter strands (11) so that the semiconductor layer sequence (3) is removed in gaps (12) between adjacent emitter strands (11),
C) Applying a passivation layer (4), the semiconductor layer sequence (3) at waveguide contacts (51) remote from the growth substrate (2) and the gaps (12) remaining at least partially free,
D) Producing at least one metal layer (50), which extends from the waveguide contacts (51) into the gaps (12),
E) Replacing the growth substrate (2) with a carrier (6),
F) Making vias (53) in the carrier (6) so that the metal layer (50) and underside contacts (52) of the semiconductor
(Continued)

Figure 1:
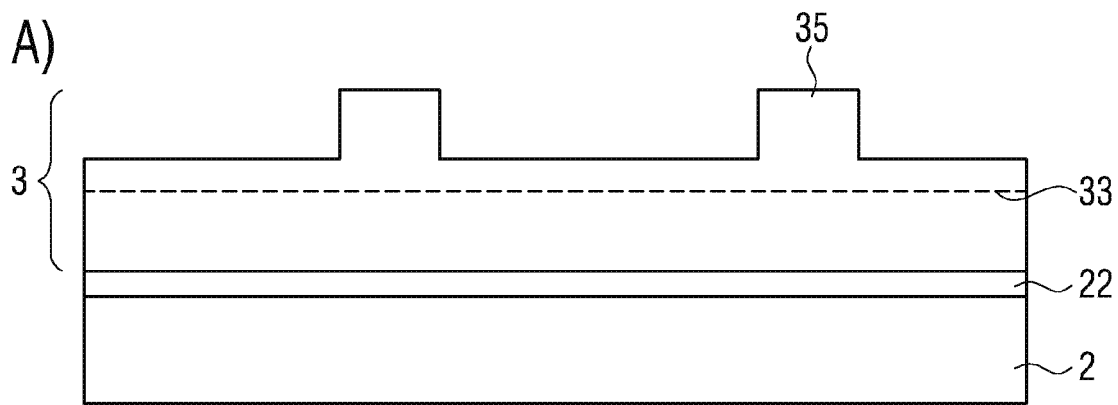
Figure 1:
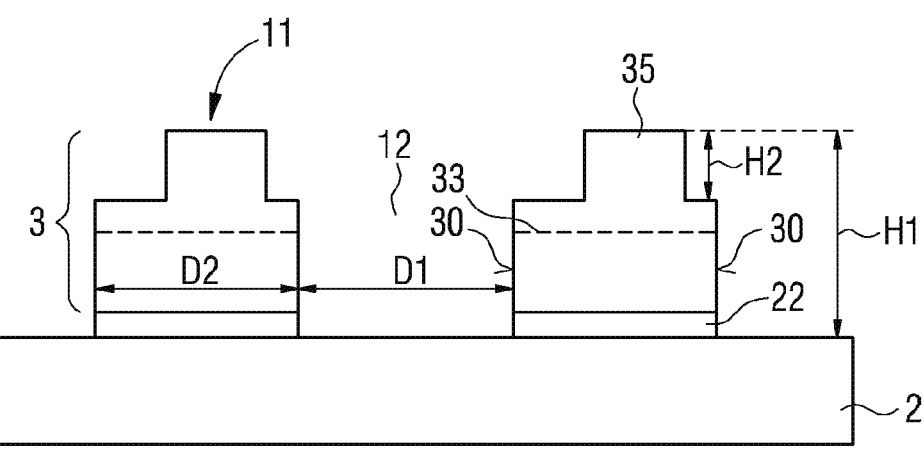
Figure 1:
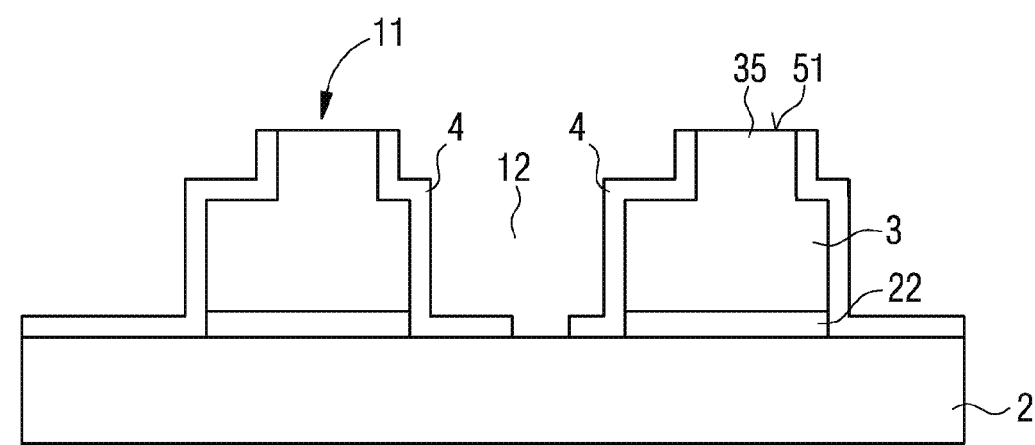
Figure 1:
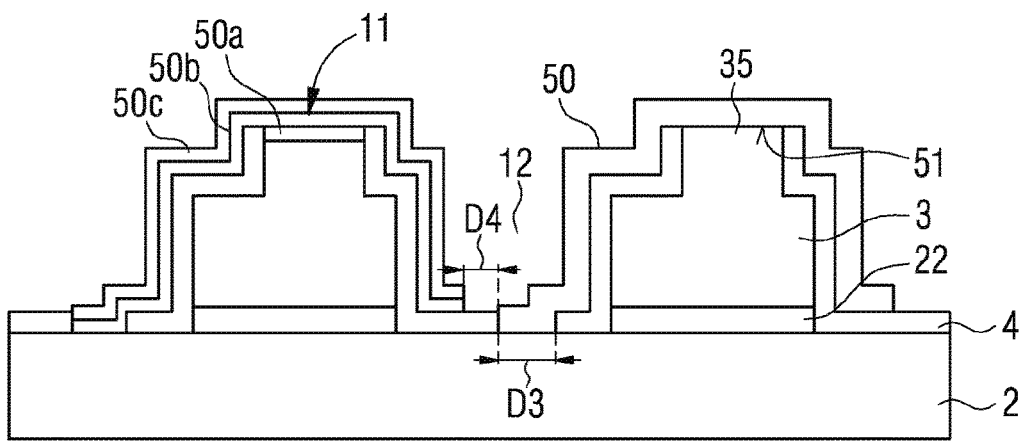
Figure 1:
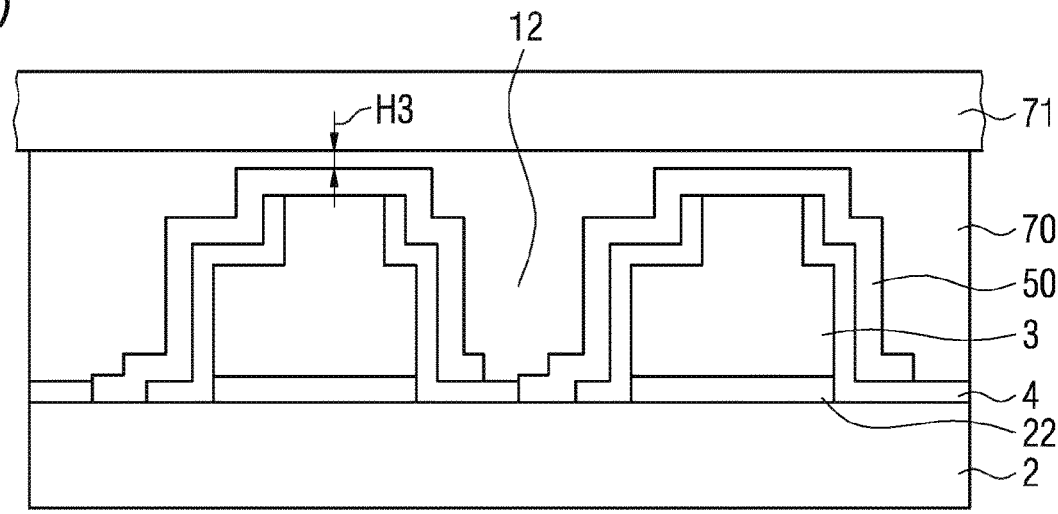
Figure 1:
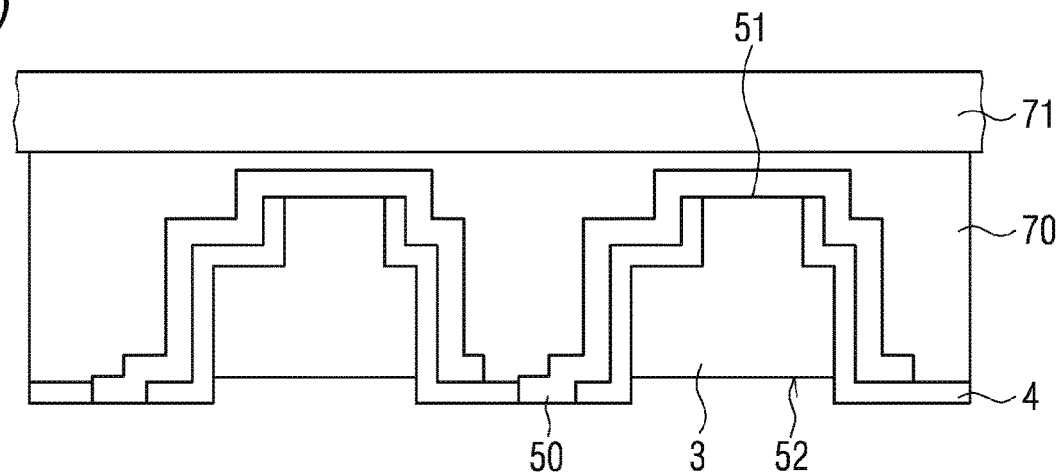
Figure 1:
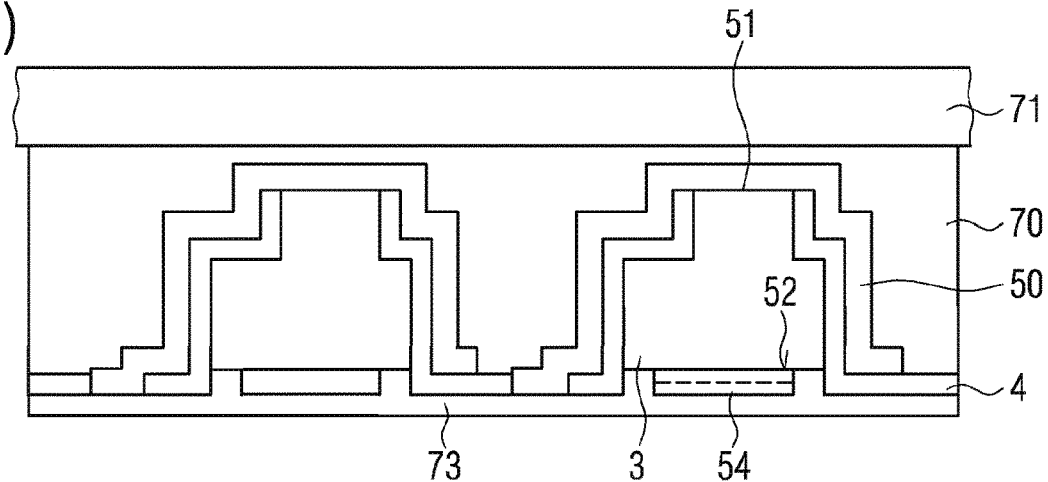
Figure 1:
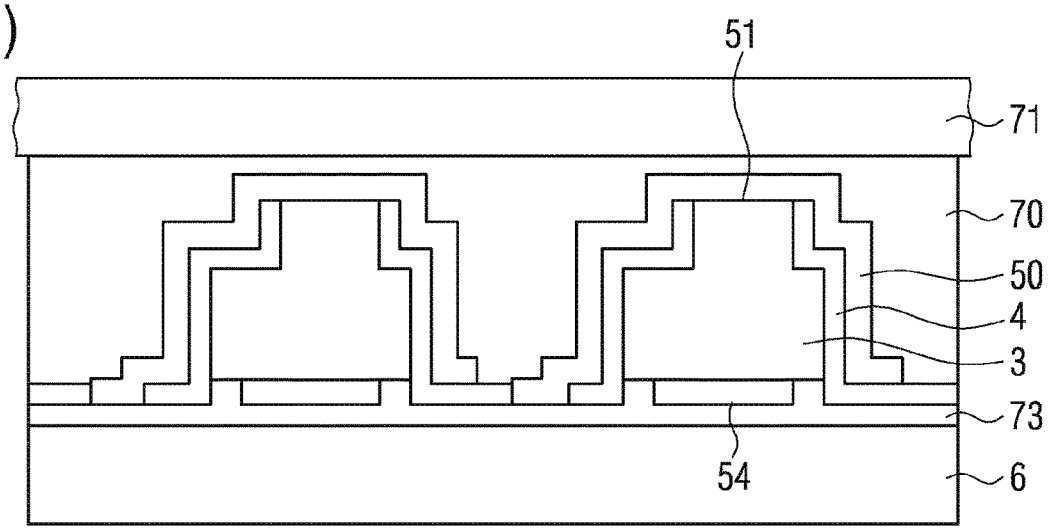
Figure 1:
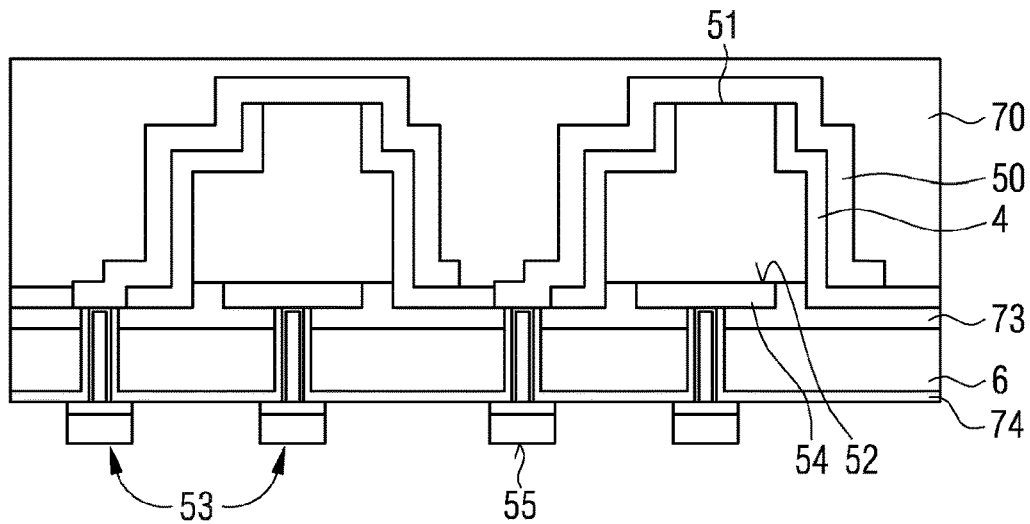
Figure 1:
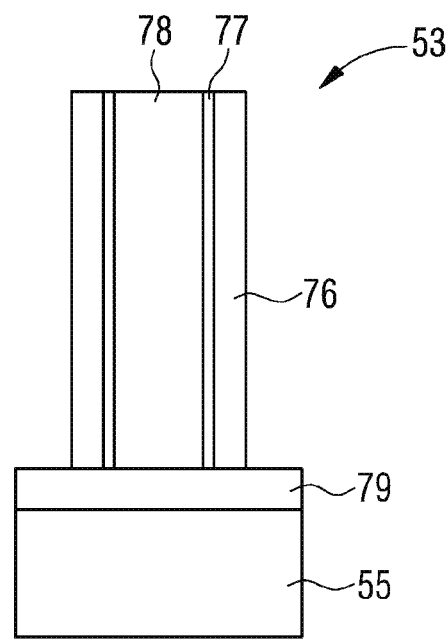
Figure 1:
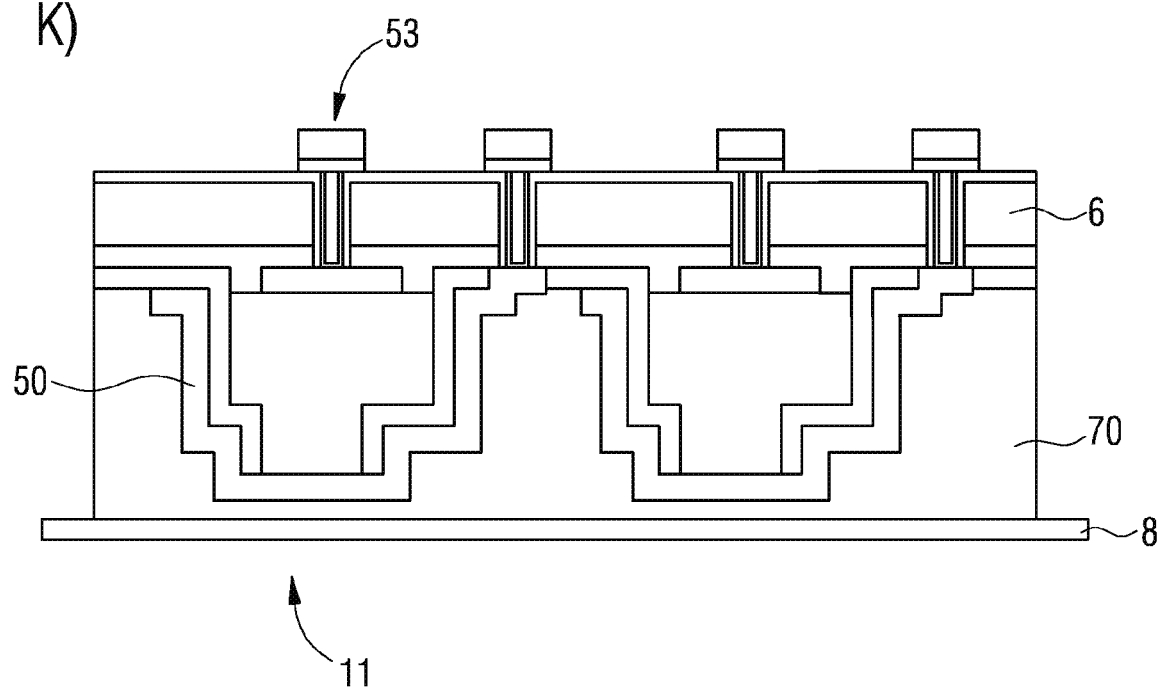
Figure 1:
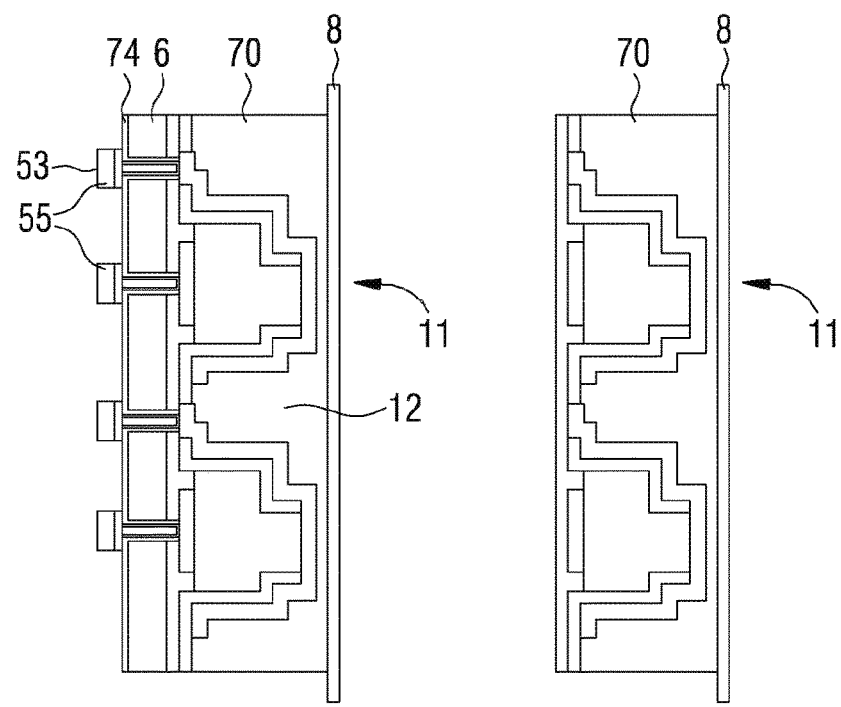
Figure 1:
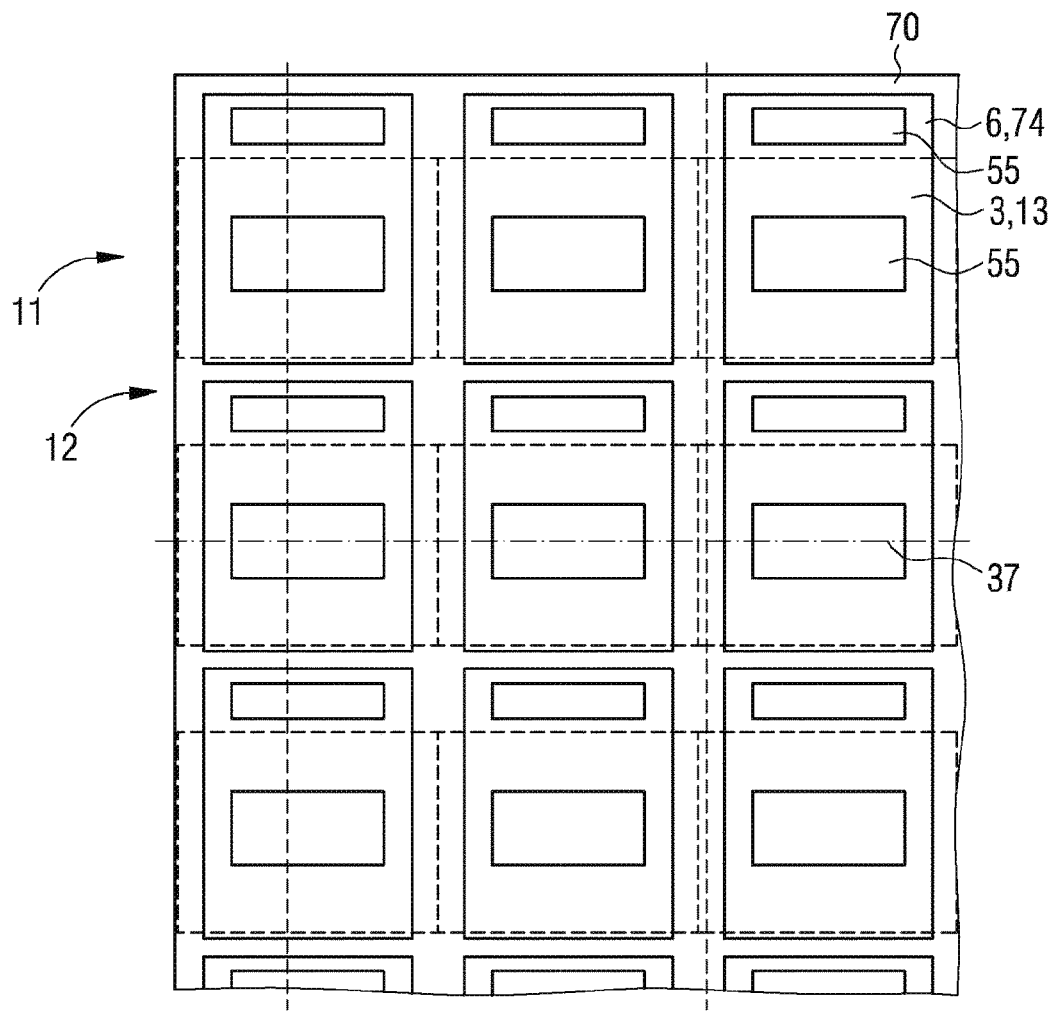
Figure 1:
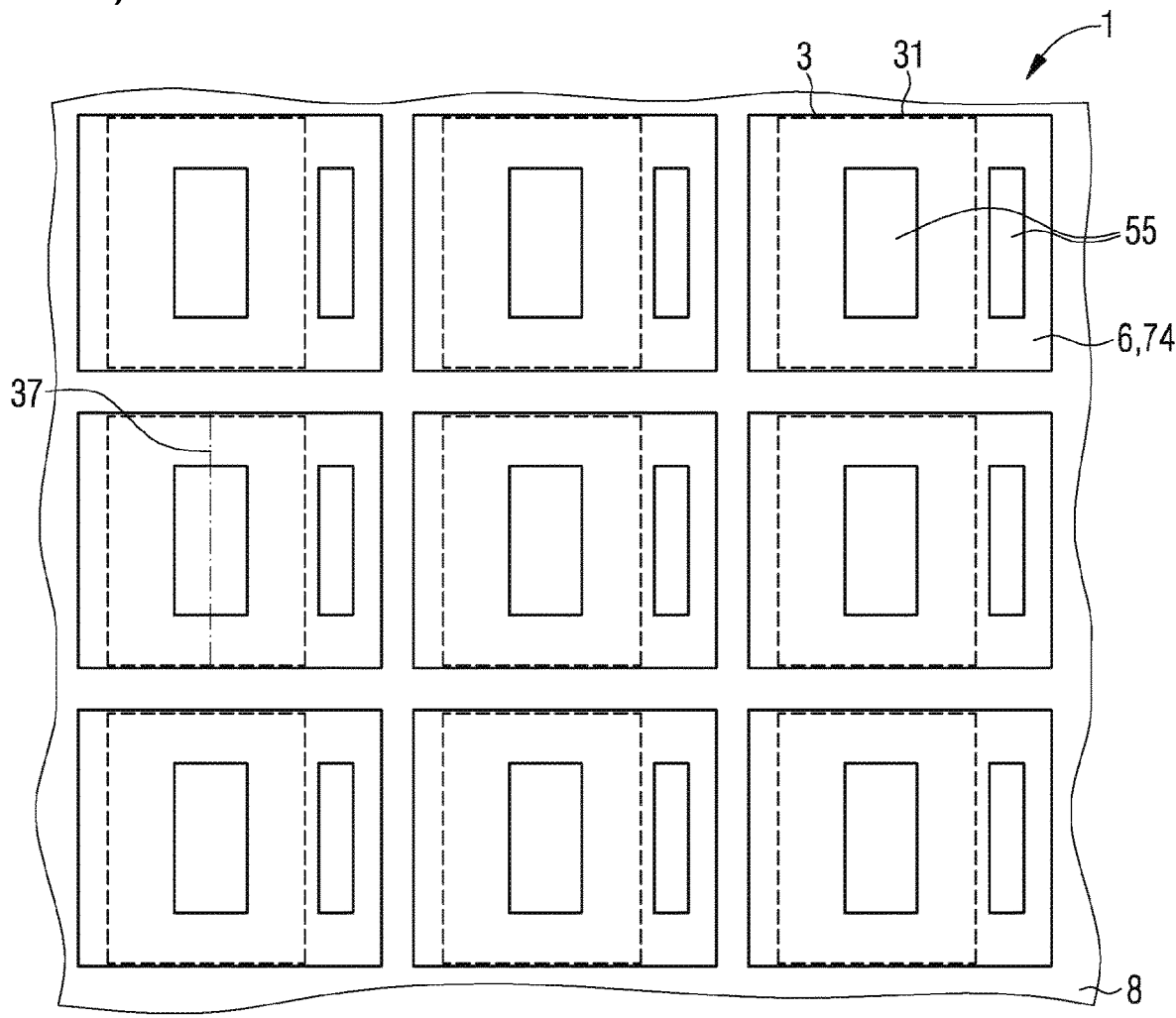
Figure 1:
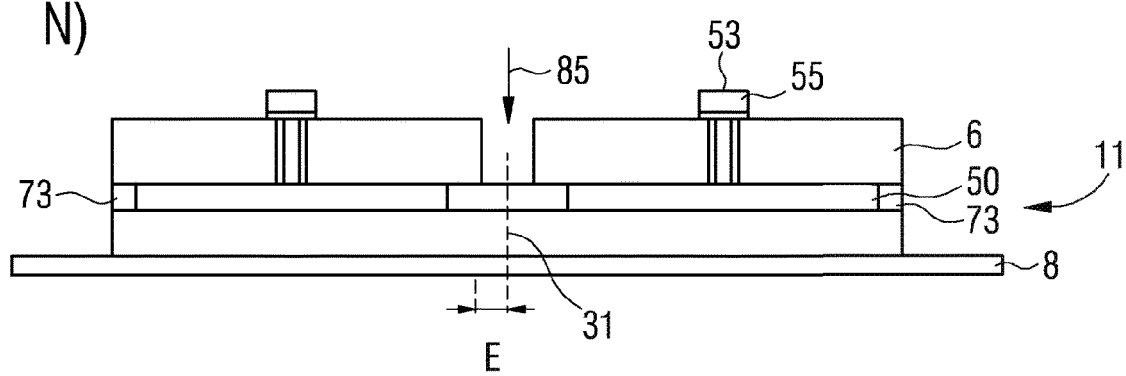

layer sequence (3) facing the carrier (6) are electrically contacted, and removing the carrier (6) between at least some of the emitter strands (11) and between emitter units (13) following one another along the emitter strands (11), and G) Breaking the semiconductor layer sequence (3) between the emitter units (13), so that facets (31) are formed.

19 Claims, 10 Drawing Sheets

(56) References Cited

U.S. PATENT DOCUMENTS

| | | |
|---|---|---|
| 2003/0031218 A1 | 2/2003 | Yeh |
| 2006/0109883 A1 | 5/2006 | Lewis et al. |
| 2009/0294789 A1 | 12/2009 | Yoshida |
| 2011/0193056 A1 | 8/2011 | Wang |
| 2012/0181568 A1 | 7/2012 | Hsia et al. |
| 2012/0248977 A1 | 10/2012 | Ootorii |
| 2016/0372893 A1 | 12/2016 | McLaurin et al. |
| 2020/0328324 A1* | 10/2020 | Muller .............. H01L 33/0095 |

FOREIGN PATENT DOCUMENTS

| | | |
|---|---|---|
| JP | H09167878 A | 6/1997 |
| JP | H09298339 A | 11/1997 |
| JP | 2004047918 A | 2/2004 |
| JP | 2006237339 A | 6/2006 |
| JP | 2009212179 A | 9/2009 |
| WO | 2018114812 | 6/2018 |

OTHER PUBLICATIONS

Japanese Notice of Resorts for Rejection dated Jun. 22, 2021 for corresponding Japanese Application No. 2020-526447, 17 pages.

* cited by examiner

A)

B)

C)

D)

E)

F)

G)

H)

I)

J)

K)

L)

M)

N)

A)

B)

METHOD FOR PRODUCING OPTOELECTRIC SEMICONDUCTOR COMPONENTS, AND OPTOELECTRONIC SEMICONDUCTOR COMPONENT

CROSS-REFERENCE TO RELATED APPLICATIONS

This patent application is a national stage entry from International Application No. PCT/EP2018/082865, filed on Nov. 28, 2018, published as International Publication No. WO 2019/115234 A1 on Jun. 20, 2019, and claims priority under 35 U.S.C. § 119 from German patent application 10 2017 130 131.3, filed Dec. 15, 2017, the entire contents of all of which are incorporated herein by reference.

A method for the manufacture of optoelectronic semiconductor components is specified. In addition, an optoelectronic semiconductor component is specified.

An object to be solved is to specify a method by which a surface-mountable semiconductor laser can be efficiently manufactured.

This object is solved, inter alia, by a method with the features of claim 1. Preferred further developments are the subject of the other claims.

According to at least one embodiment, optoelectronic semiconductor components are manufactured by the method. The semiconductor components are preferably laser diodes, LDs for short. Alternatively, light-emitting diodes, short LEDs, or light-emitting diodes with a resonant cavity, short RC-LEDs, can be manufactured.

According to at least one embodiment, the process comprises the step of growing a semiconductor layer sequence on a growth substrate. The semiconductor layer sequence is configured for radiation generation.

The semiconductor layer sequence has at least one active zone which is set up to generate radiation during operation of the light-emitting diode chip. The generated radiation is preferably coherent. The semiconductor layer sequence is preferably based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or also around an arsenide compound semiconductor material such as $Al_nIn_{1-n-m}Ga_mAs$ or such as $Al_nGa_mIn_{1-n-m}As_kP_{1-k}$, where $0 \leq n \leq 1$, $0 \leq m \leq 1$ and $n+m \leq 1$ and $0 \leq k < 1$ hold respectively. Preferably for at least one layer or for all layers of the semiconductor layer sequence $0 < n \leq 0.8$, $0.4 \leq m < 1$ and $n+m \leq 0.95$ as well as $0 < k \leq 0.5$ hold. The semiconductor layer sequence may contain dopants as well as additional components. For the sake of simplicity, however, only the essential constituents of the crystal lattice of the semiconductor layer sequence, i.e. Al, As, Ga, In, N or P, are given, even if these may be partially replaced and/or supplemented by small amounts of other substances. Preferably the semiconductor layer sequence is based on the material system AlInGaAs.

In particular, the growth substrate is a GaAs substrate. Alternatively, growth substrates such as GaN, sapphire, silicon carbide or silicon can be used, depending on the material system for the semiconductor layer sequence.

According to at least one embodiment, the method comprises the step of structuring the semiconductor layer sequence into emitter strands. In this step, the semiconductor layer sequence is completely or partially removed in gaps between adjacent emitter strands. It is possible that in the gaps the growth substrate or a growth layer for the semiconductor layer sequence located on the growth substrate is exposed. The emitter strands preferably run parallel to main emission directions and/or resonators of the finished semiconductor components.

According to at least one embodiment, the method comprises the step of applying a passivation layer. The passivation layer is preferably produced in such a way that the semiconductor layer sequence remains free at waveguide contacts facing away from the growth substrate. The waveguide contacts are intended for feeding current into the semiconductor layer sequence. A highly doped semiconductor contact layer of the semiconductor layer sequence can be located at the waveguide contacts. Alternatively or additionally, it is possible that the gaps remain partially or completely free of the passivation layer.

According to at least one embodiment, at least one metal layer is produced, which extends from the waveguide contacts into the gaps. Via the metal layer or layers, an electrical contact of the semiconductor layer sequence at the waveguide contacts is later possible.

According to at least one embodiment, the growth substrate is replaced by a carrier. The growth substrate is removed, for example, by etching, especially by wet etching. Furthermore, it is possible to remove the growth substrate partially or completely by grinding or polishing. In the case of translucent growth substrates, it is possible to remove the growth substrate by means of laser radiation, also known as laser lift-off or LLO. The carrier that replaces the growth substrate is preferably a permanent carrier, at least part of which is present in the finished semiconductor components. In particular, the carrier is the component of the finished semiconductor components that mechanically supports and stabilizes the semiconductor components.

According to at least one embodiment, vias are made in the carrier. Via the vias, the metal layer and thus the waveguide contact can be electrically connected from a side of the carrier facing away from the semiconductor layer sequence. Furthermore, the vias electrically contact underside contacts of the semiconductor layer sequence, which face the carrier and thus previously the growth substrate. Like the waveguide contacts, the underside contacts are also preferably provided with a highly doped semiconductor contact layer.

Thus, the semiconductor components can be surface-mounted. All electrical contact surfaces for external electrical contacting of the finished semiconductor components are therefore preferably located on the side of the carrier facing away from the semiconductor layer sequence.

According to at least one embodiment, the carrier is removed between at least some of the emitter strands and between emitter units following one another along the emitter strands. The finished semiconductor components each have one emitter unit of the semiconductor layer sequence, viewed along the emitter strands. By removing the carrier from areas between adjacent emitter units, it is possible to efficiently singulate the semiconductor layer sequence.

According to at least one embodiment, the method comprises the step of breaking the semiconductor layer sequence between the emitter units. The breaking results in facets. The facets of the semiconductor layer sequence are configured to reflect and/or couple out a radiation generated in the semiconductor layer sequence during operation. Preferably, breaking essentially only affects the semiconductor layer sequence. In particular, the carrier is not or not significantly affected by the breaking, preferably just as little as the metal layer. This means that a splitting of the carrier into units for the optoelectronic semiconductor components takes place before the breaking.

In at least one embodiment, the method is configured for the manufacture of optoelectronic semiconductor components and comprises the following steps, preferably in the order given:
A) Growing a semiconductor layer sequence for radiation generation on a growth substrate,
B) Structuring the semiconductor layer sequence into emitter strands so that the semiconductor layer sequence is removed in gaps between adjacent emitter strands,
C) Applying a passivation layer, whereby the semiconductor layer sequence at the waveguide contacts remote from the growth substrate and the gaps remain at least partially free,
D) Producing at least one metal layer that extends from the waveguide contacts into the gaps,
E) Replacing the growth substrate with a carrier,
F) Making vias in the carrier so that the metal layer and the bottom contacts facing the carrier of the semiconductor layer sequence are electrically contacted and removing the carrier between at least some of the emitter strands and between emitter units succeeding along the emitter strands, and
G) Breaking the semiconductor layer sequence between the emitter units, so that facets are formed.

With the methods described here, a two-sided electrical contacting of the semiconductor layer sequence is possible, especially at the waveguide contacts and bottom side contacts opposite each other, whereby complex wire bond processes can be dispensed with and whereby lower component heights can be realized, especially since bonding wires are no longer required. Furthermore, costly laser scribing processes and breaking processes through a growth substrate can be avoided when separating laser bars and especially laser diodes.

Usually, semiconductor laser diodes are contacted from two different sides, whereby one contact is typically made by wire bonding. A light-emitting epitaxial layer is usually located on the homoepitaxial substrate required for growth, for example a GaAs substrate, which has a relatively poor thermal conductivity. The separation of laser bars and laser diodes is achieved in a comparatively complex and cost-intensive manner by means of laser scribing and breaking, whereby laser grooves are first set and then broken through the thick growth substrate and usually also through a tough back metal.

In the method described here, the epitaxial layers are removed in partial areas of the laser diode chips and an electrically conductive layer, the metal layer, is guided from an upper contact of the laser into an etched area, for example from a p-conductive semiconductor contact layer of an infrared emitting strip waveguide laser in an area next to the strip waveguides which also serves as a mesa trench. Furthermore, the partially processed wafer, i.e. the growth substrate with the semiconductor layer sequence, is preferably bonded onto an auxiliary carrier. Subsequently, the growth substrate is removed, for example by grinding and etching. A contact layer is then applied in the exposed areas, especially on a suitable n-semiconductor contact layer in the case of IR strip waveguide lasers, and the surrounding areas are filled and levelled.

The light-emitting epitaxial layer is then bonded to the carrier, which is in particular a silicon substrate. This bonding is preferably a direct bonding process using two silicon oxide surfaces. Furthermore, the carrier can be thinned, for example to about 120 µm. Via etching processes, the application of an insulation and filling with electrically conductive material completely or partially, through vias are created, also known as Through Silicon Vias or TSV for short. By applying a suitable metal stack to the TSV, the semiconductor components can later be efficiently bonded and accommodated in a package, for example by means of SMT. Furthermore, the auxiliary carrier is removed and the carrier is structured, in particular by plasma etching, between the later individual semiconductor components, especially parallel to the later emission direction of an infrared strip waveguide laser as well as in the area perpendicular thereto. Finally, the laser facets are generated by means of a breaking process, in particular by means of a breaking blade, and expanded on a foil.

Bonding onto a carrier such as a silicon substrate leads to better heat dissipation through the carrier, especially in the case of IR laser diodes, compared to the case where the light-emitting epitaxial layers remain on the growth substrate such as GaAs. For example, the thermal conductivity of silicon is about 150 W/m·K, whereas GaAs has a thermal conductivity of only about 55 W/m·K. This allows good laser performance at high temperatures.

In addition, by bonding from the growth substrate to the carrier, further treatment, in particular TSV processing, can also be carried out on equipment designed for the wafer size of the carrier. For example, a 2" GaN wafer can be directly bonded to a 6" silicon wafer, which can then be further processed as a 6" system. Thus a high production capability is achieved.

Due to the preferably solder-free direct bonding and the etching of the carrier in the area of the laser facet, a very good breaking quality of the epitaxial layers can be achieved with facet breaking, since with facet breaking, essentially only the semiconductor layer sequence has to be broken, but not the thick growth substrate or a tough metal layer. Laser scribing of the growth substrate and backside metals can also be omitted. Thus, a high facet quality can be achieved and a cost-effective parallelizable separation process can be used.

Due to TSV contacting, no bonding wires are required, thus ensuring a low overall height and a good high frequency capability. In addition, the semiconductor components, especially in the form of laser diodes, can be easily integrated into a package with several semiconductor components, as comparatively complicated wire bonding is no longer necessary. A multiple arrangement can be used either as a single chip or as a multichip, also known as bars. Thus a smaller package can be achieved, which also has improved high frequency properties.

According to at least one embodiment, the semiconductor components are edge-emitting lasers. The lasers can have a strip waveguide and thus be index-guided. It is also possible that the lasers are gain-guided, so that a mode is essentially guided by setting a current feeding range of an active zone.

According to at least one embodiment, the passivation layer is applied directly to the semiconductor layer sequence. Furthermore, the metal layer is preferably deposited directly on the passivation layer. Thus the metal layer has a small distance to the semiconductor layer sequence, which essentially corresponds to the thickness of the passivation layer. A thickness of the passivation layer is preferably at least 20 nm or 40 nm and/or at most 1000 nm or 200 nm or 100 nm.

According to at least one embodiment, the metal layer reproduces side surfaces of the emitter strands. This means that seen in cross-section, the metal layer has the same geometry as the side surfaces of the semiconductor layer sequence. The metal layer can therefore be seen as a geometrical imprint of the emitter strands on the side surfaces.

According to at least one embodiment, the facets or part of the facets are configured for radiation extraction from the finished semiconductor components. It is also possible that some of the facets are designed to reflect the radiation. The facets can act solely due to the refractive index difference to an environment. Alternatively, it is possible that reflective layers such as Bragg mirrors or anti-reflective layers are applied to the facets either over the entire surface or in places. Locally, radiation-absorbing layers can also be created on the facets. Furthermore, the facets can be passivated, in particular to avoid oxidation of the facets.

According to at least one embodiment, the facets protrude over the associated carrier after step F) and especially in the finished semiconductor components. The protrusion is present in particular in a direction parallel to a resonator axis of the semiconductor lasers. For example, the protrusion is at least 2 µm or 5 µm or 10 µm. Alternatively or additionally, this protrusion is at most 100 µm or 50 µm or 20 µm.

According to at least one embodiment, strip waveguides are generated on a side of the semiconductor layer sequence remote from the growth substrate before step C). The strip waveguides are preferably configured for one-dimensional beam guiding in the direction parallel to the emitter strands, also known as index guiding. The resonator axis is defined by the strip waveguide. The waveguide contacts are preferably located at the corresponding strip waveguide.

According to at least one embodiment, a side of the semiconductor layer sequence remote from the growth substrate is planar in the area of a current feeding width of the active zone of the semiconductor layer sequence. Thus, the finished semiconductor components can be designed as gain-guided lasers. In this case no strip waveguide is available. With gain-guided lasers, it is possible that trenches are etched into the semiconductor layer sequence on the side of the semiconductor layer sequence facing away from the growth substrate. These trenches are not configured for wave guiding, but for increased scattering of radiation not running along the resonator axis.

According to at least one embodiment, a filling layer is produced between steps D) and E). The filling layer fills the gaps between adjacent emitter strands, in particular without gaps or cavities. This means that one side of the filling layer facing away from the growth substrate is preferably planar. The filling layer can be designed as planarization. Preferably, the filling layer is made of an oxide such as silicon oxide or a nitride such as aluminum nitride.

According to at least one embodiment, an auxiliary carrier is attached to the filling layer after creating the filling layer. The auxiliary carrier is for example a glass carrier or a silicon carrier. The attachment of the filling layer to the auxiliary carrier is preferably carried out by means of silicon oxide-silicon oxide direct bonding and thus without bonding agents. Alternatively, the bonding can also be done using BCB (benzocyclobutene).

According to at least one embodiment, an etch stop layer is created between the semiconductor layer sequence and the growth substrate before or with step A). Preferably, the growth substrate is selectively etchable compared to the etch stop layer. For example, an etching rate for the growth substrate is at least by a factor of 100 or 1000 or 10000 higher than for the etch stop layer. If the growth substrate is a GaAs substrate, the etch stop layer is preferably made of AlGaAs with an aluminum content of at least 20%.

According to at least one embodiment, the etch stop layer is partially or completely removed from the gaps between the emitter strands in step B). The remaining residues of the etch stop layer are preferably removed in step E) between the removal of the growth substrate and the attachment of the carrier.

According to at least one embodiment, at least one contact layer is created at each of the bottom contacts after removing the residues of the etch stop layer and before attaching the carrier. The contact layer or layers are preferably made of one or more metals each or alternatively of transparent conductive oxides. Preferably, the at least one contact layer is a metal layer, especially a metal layer stack.

According to at least one embodiment, the contact layers at the bottom contacts are covered with a planarization layer. The planarization layer is an oxide, such as silicon oxide, or alternatively an electrically insulating nitride. Furthermore, diamond-like carbon layers, DLC for short, can also be used, for example to achieve better heat dissipation. Electrical short circuits can be avoided by the planarization layer.

According to at least one embodiment, the carrier is directly and areally bonded to the planarization layer. Subsequently, the intermediate carrier is preferably removed.

According to at least one embodiment, the metal layer extends on both sides of the emitter strands from the respective waveguide contacts to the adjacent gaps. Thus, the metal layer can surround the semiconductor layer sequence symmetrically as seen in cross-section.

According to at least one embodiment, there are exactly two or three of the vias per emitter unit in the direction perpendicular to the emitter strands. In the case of three vias, the via for the bottom contact of the respective emitter unit is preferably located centrally between the two vias for the waveguide contacts.

According to at least one embodiment, only one via is provided per emitter unit in the direction parallel to the emitter strands, thus in particular also in the direction parallel to the resonator axis of the semiconductor lasers, per bottom side contact and/or per waveguide contact. Alternatively, it is possible that several vias are provided for the bottom contact and/or for the waveguide contact. These vias preferably follow one another along the resonator axis, especially in a straight line or also in a winding, for example sinusoidal line.

According to at least one embodiment, the metal layer is divided along the emitter strands per emitter unit into several electrically independently controllable subregions. This means that the semiconductor layer sequence in the emitter units can preferably be controlled section by section. Alternatively or additionally, the same applies to the waveguide contacts. Thus, several waveguide contacts and/or bottom side contacts can be present per emitter unit.

According to at least one embodiment, the metal layer extends along the emitter strands to at least 80% or 90% or 95% or completely along the emitter units. This means that the side surfaces of the semiconductor layer sequence can be covered along the emitter strands and thus along the resonator axis of the semiconductor lasers predominantly or completely by the metal layer. If the metal layer and/or the waveguide contacts and/or the underside contacts are structured, there are preferably only narrow strips free of the metal layer between adjacent subareas of the metal layer.

Furthermore, the metal layer preferably does not extend to the facets of the respective emitter unit. For example, a distance between the facets and the metal layer along the resonator axis is at least 1 µm or 2 µm or 5 µm and/or at most 50 µm or 20 µm or 10 µm. If the metal layer does not reach the facets, breaking of the semiconductor layer sequence and the emitter strands is simplified.

According to at least one embodiment, several of the emitter units are electrically connected in series in a direction perpendicular to the emitter strands. This is possible by structuring the vias and associated electrical cross-connections accordingly. In step F) the carrier preferably remains only between emitter units connected in series between adjacent emitter strands. Between adjacent emitter strands whose associated emitter units are not connected in series, the carrier is preferably removed completely in step F).

In addition, an optoelectronic semiconductor component is specified. The semiconductor component is manufactured by a method as described in connection with one or more of the above mentioned embodiments. Characteristics of the semiconductor component are therefore also disclosed for the method and vice versa.

In at least one embodiment the semiconductor component is surface mountable and has a carrier in which several electrical vias are located. A semiconductor layer sequence with an active zone for radiation generation is attached to the carrier. A passivation layer completely covers side surfaces of the semiconductor layer sequence and leaves a waveguide contact facing away from the carrier partially or completely exposed. One or more metal layers extend from the waveguide contact to the carrier. The vias electrically contact the metal layer and an underside contact of the semiconductor layer sequence facing the carrier. A facet of the semiconductor layer sequence for radiation extraction protrudes over the carrier in a direction parallel to a resonator axis of the semiconductor component. The metal layer reproduces the side surfaces of the emitter strands so that an average distance between the metal layer and the semiconductor layer sequence is at most 1 µm or 0.5 µm, especially when viewed in cross-section.

In the following, a method described here and an optoelectronic semiconductor component described here are explained in more detail with reference to the drawing using exemplary embodiments. Identical reference signs indicate identical elements in the individual figures. However, no scale references are shown here; instead, individual elements may be shown in exaggerated sizes for better understanding.

Figure 2:
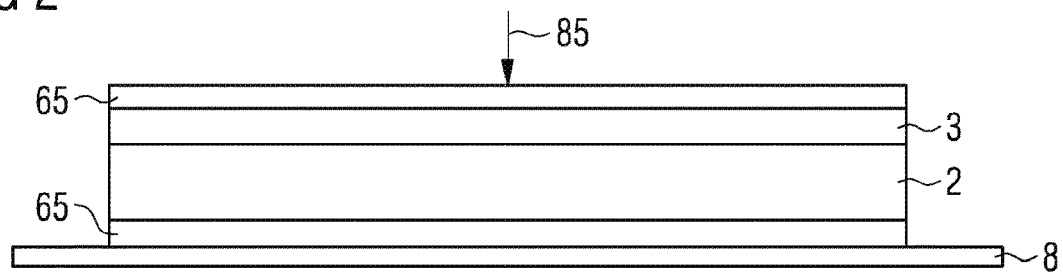
Figure 3:
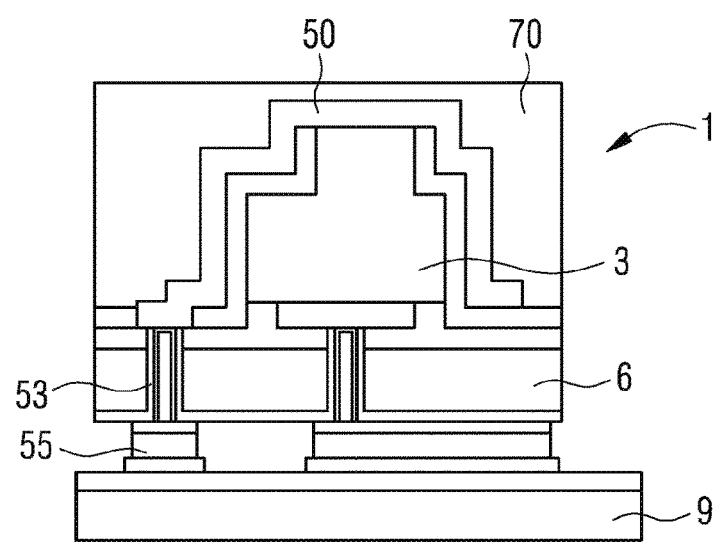
Figure 4:
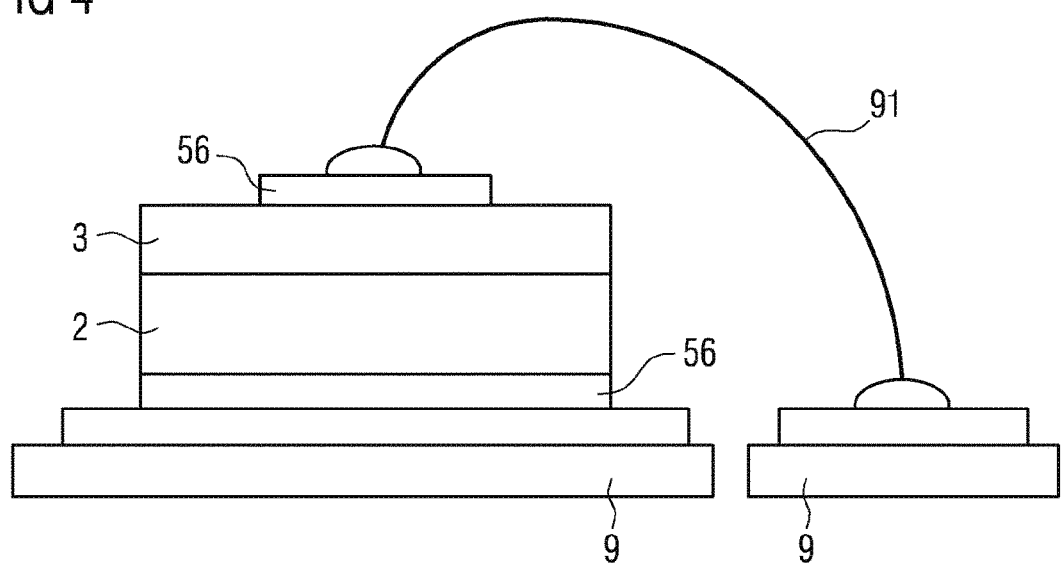
Figure 9:
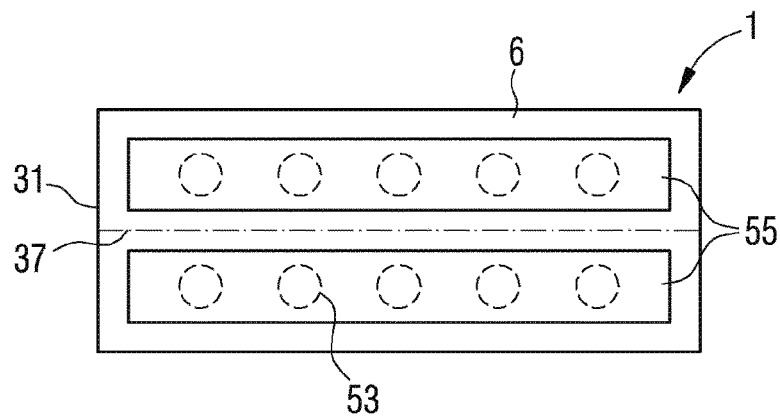
Figure 9:
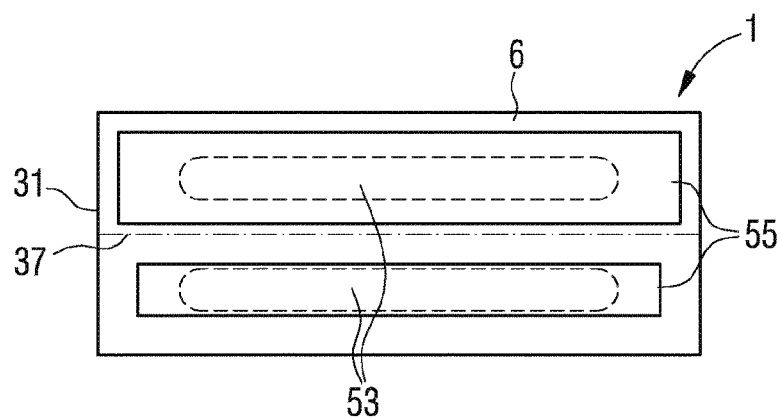
Figure 9:
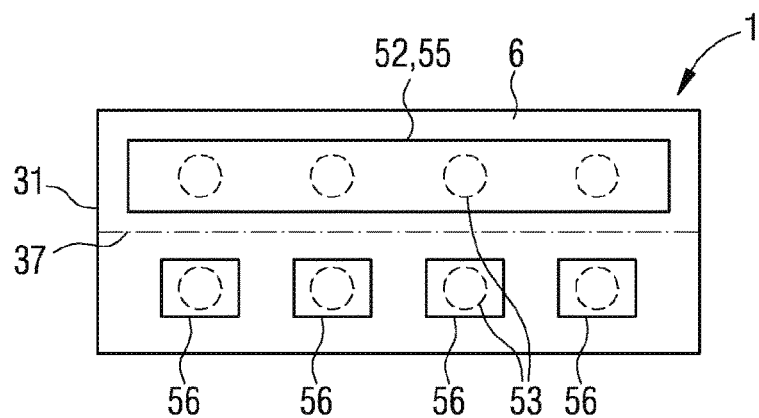
Figure 9:
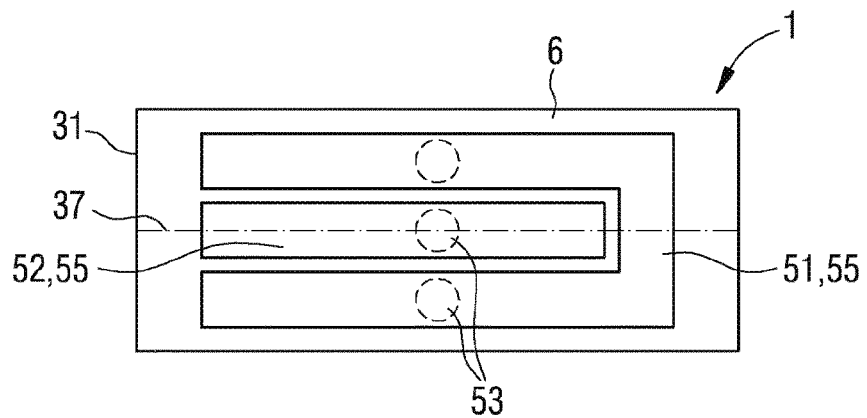

In the Figures:

FIGS. 1A to 1I show schematic sectional views of method steps of a method described here, FIG. 1J show a schematic sectional view of a via for optoelectronic semiconductor components described here, FIG. 1K show a schematic sectional view of a method step of a method described here, FIG. 1L shows a schematic top view and two corresponding sectional views of a method step of a method described here, FIG. 1M shows a schematic top view of a method step of a method described here, FIG. 1N shows a schematic sectional view of a method step of a method described here, FIG. 2 shows a schematic sectional view of a variation of a manufacturing method, FIG. 3 shows a schematic sectional view of an exemplary embodiment of an optoelectronic semiconductor component described here, FIG. 4 shows a schematic sectional view of a variation of a semiconductor component, FIGS. 5 to 8 show schematic sectional views of exemplary embodiments of optoelectronic semiconductor components described here, and FIG. 9 shows schematic top views of exemplary embodiments of optoelectronic semiconductor components described here.

In FIG. 1 an exemplary embodiment of a manufacturing method for optoelectronic semiconductor components 1 is illustrated.

A growth substrate 2 is provided as shown in FIG. 1A. The growth substrate 2 is a GaAs substrate, for instance.

Optionally, an etch stop layer 22 is provided on the growth substrate 2. For example, the etch stop layer 22 is made of AlGaAs with an aluminum content of 30%.

A semiconductor layer sequence 3 is epitaxially grown on the etch stop layer 22. The semiconductor layer sequence 3 comprises an active zone 33 and is based on the AlInGaAs material system, for example.

Optionally, several strip waveguides 35 are produced by etching on a side of the semiconductor layer sequence 3 that is remote from the growth substrate 2. The strip waveguides 35 extend in the direction perpendicular to the drawing plane in FIG. 1A, as well as resonator axes defined by the strip waveguides 35.

In the method step of FIG. 1B, the semiconductor layer sequence 3 is structured into emitter strands 11 extending perpendicular to the drawing plane. Each of the emitter strands 11 preferably has one of the strip waveguides 35. Gaps 12 are formed between adjacent emitter strands 11, in which the growth substrate 2 or, in contrast to FIG. 1B, the etch stop layer 22 is exposed.

A height H1 of the semiconductor layer sequence 3 together with the etch stop layer 22 is about 3 µm. For example, a height H2 of strip waveguide 35 is 0.5 µm. The active zone 33 can be located below the strip waveguide 35. In particular, a thickness of the etch stop layer 22 is at least 100 nm and/or at most 1000 nm.

A distance D1 between adjacent emitter strands 11 is preferably at least 20 µm and/or at most 100 µm, for example around 50 µm, and is thus comparatively large. A width D2 of emitter strands 11 is preferably at least 100 µm.

FIG. 1C illustrates that a passivation layer 4 is produced. The passivation layer 4 is made of silicon dioxide, for example, and has a thickness of between 100 nm and 500 nm in particular. The comparatively thin passivation layer 4 leaves the growth substrate 2 free in the gaps 12 in places. The strip waveguide 35 is also free of the passivation layer 4, so that a waveguide contact 51 is formed there on a semiconductor contact layer.

As shown in FIG. 1D, metal layers 50 are produced, which are located on the passivation layer 4 and on the waveguide contacts 51. The left side of FIG. 1D shows that several metal layers 50a, 50b, 50c are present. The metal layer 50a is restricted to the waveguide contact 51. The metal layer 50a, for example, is a platinum layer. The remaining metal layers 50b, 50c are congruent with each other from the strip waveguide 35 up to the gaps 12. The metal layers 50b, 50c are for example made of titanium, platinum, palladium or gold. In contrast, in FIG. 1D, right-hand side, there is only a single metal layer 50. The configuration in the left half of FIG. 1D is preferred.

To avoid electrical short circuits, the metal layer 50 does not extend continuously over the emitter strands 11. A distance D4 between the metal layers 50 of adjacent emitter strands 11 is preferably at least 2 µm or 5 µm and/or at most 20 µm or 10 µm. A width D3, within which the metal layer 50 is in contact with the growth substrate 2, is preferably at least 10 µm and/or at most 40 µm. A thickness of the metal layers 50a, 50b, 50c together or of the metal layer 50 is for example at least 0.3 µm and/or at most 5 µm.

In the step of FIG. 1E a filler layer 70 is produced, for example from silicon dioxide. A planarization is achieved via the filling layer 70. A height H3, with which the filling layer 70 protrudes above the metal layer 50, is preferably at least 0.2 µm or 0.5 µm and/or at most 2 µm or 1 µm.

For example, direct bonding is used to areally apply an auxiliary carrier 71, especially made of silicon, to the filling layer 70.

In FIG. 1F the growth substrate 2 is removed. The growth substrate 2 is preferably removed by grinding and wet chemical etching, with etch stop layer 22 preferably stopping etching. After removing the growth substrate 2, the etch stop layer 22 can also be removed. Alternatively, the etch stop layer 22 can remain on the remaining semiconductor layer sequence 3.

In this way, one bottom contact 52 is formed opposite each waveguide contact 51. The passivation layer 4 can overhang the underside contacts 52 in the direction away from the waveguide contacts 51.

In the step of FIG. 1G, a contact layer 54 is created at each underside contact 52. The contact layer 54 can be a single layer, see the left side in FIG. 1G, or, preferably, a stack of layers, see the right side in FIG. 1G. The contact layer 54 is preferably a metallic layer or stack of metallic layers.

Subsequently, a planarization layer 73 is applied, which covers the contact layer 54 as well as the passivation layer 4 and also the metal layer 50 completely and in planar manner. The planarization layer 73 is electrically insulating and made of silicon dioxide, for example.

A carrier 6 is then applied, see FIG. 1H. The carrier 6 is preferably attached to the planarization layer 73 by direct bonding. Carrier 6 is preferably a doped or undoped silicon carrier. After an optional thinning process, the carrier 6 has a thickness between 60 µm and 250 µm, for example.

According to FIG. 1I, several electrical vias 53 are created through the carrier 6. Via the vias 53 the metal layer 50 and thus the waveguide contacts 51 are electrically contacted. On the other hand, the contact layers 54 are electrically connected to the underside contacts 52. The vias 53 also form electrical contact areas 55 for external electrical contacting.

The auxiliary carrier may already have been removed in the step of FIG. 1I or, in contrast to the illustration, may still be present.

FIG. 1J illustrates an example of one of the vias 53 in more detail. Electrical insulation 56 is present in particular as a cylinder jacket, for example made of silicon dioxide. A thickness of the insulation 76, for example, is between 10 nm and 500 nm, preferably around 100 nm. Inside the insulation 76, a first seed layer 77 is produced, for example by sputtering or CVD (chemical vapor deposition). The first seed layer 77 is for example made of tungsten, tantalum, titanium, titanium nitride, tantalum nitride, copper or titanium tungsten nitride.

Starting from the first seed layer 77, a filling 78 is produced, for example by electroplating or CVD. The filling 78 can fill the area within the insulation 76 completely or only partially, especially in the form of a cylinder jacket. The filling 78 is for example made of tungsten, copper or nickel.

Correspondingly, a second seed layer 79 is produced perpendicular to it, to which the electrical contact surfaces 55 are applied. The finished semiconductor component 1 is electrically contactable externally via the contact surfaces 55.

FIG. 1K illustrates that an expansion film 8 is applied to the filling layer 70.

FIG. 1L illustrates a top view of contact pads 55 and, marked by arrows and dashed lines, two corresponding sectional views. The support 6 is removed along grid lines. This defines individual emitter units 13. For each emitter unit 13, for example, there are two of the contact areas 55.

Thus, the emitter strands 11, which are separated from the gaps 12, are each divided into several of the emitter units 13 in the longitudinal direction. The emitter strands 11 as shown in FIG. 1L still run continuously from left to right, as do the gaps 12, i.e. parallel to the resonator axes 37 of the semiconductor components 1. This means that the semiconductor layer sequence 3 is not yet subdivided in the area of the emitter strands 11 as shown in FIG. 1L. This can be seen in the sectional view in FIG. 1L at the top right. The sectional view in FIG. 1L top left shows that the carrier 6 is divided between adjacent emitter strings 11 in the area of the gaps 12. This creates a large number of, for example, rectangular subregions of carrier 6, one subregion for each semiconductor component 1.

Subsequently, a singulation into the semiconductor components 1 takes place via breaking, so that the emitter strands 11 are divided into the emitter units 13. Furthermore, expansion takes place via the expansion foil 8, see FIG. 1M.

Breaking is explained in FIG. 1N in more detail. Along the emitter strands 11, a tool such as a breaking blade 85 is placed between the subareas of the carrier 6 for the emitter units 13 which are still connected, thus creating facets 31 by means of breaking.

Because the carrier 6 was previously removed in the area of the facets 31, the semiconductor layer sequence 3 at the facets 31 protrudes above the respective associated carrier 6. A projection E, for example, is about 5 µm. Preferably, the metal layer 50 and the contact layers 54 not shown in FIG. 1N are also set back from the facets 51, for example by at least 1 µm or 2 µm and/or by at most 10 µm or 3 µm. In addition, the contact surfaces 55 do not extend as far as the facets 31.

A variation is shown in FIG. 2. As shown in FIG. 2, breaking is done with tool 85 when the growth substrate 2 and metallizations 65 are still present. This means that during the method, as illustrated in connection with FIG. 2, the growth substrate 2 and the metallizations 65 must also be broken up. This means increased effort and leads to a risk of the greatest scrap when creating the facets.

FIG. 3 illustrates a finished semiconductor component 1 in mounted condition on a mounting platform 9. The semiconductor component 1 is surface-mountable and connected without bonding wires.

In contrast, a bond wire 91 is required for the variation of FIG. 4 in order to achieve the electrical contact on the mounting platform 9.

Figure 5:
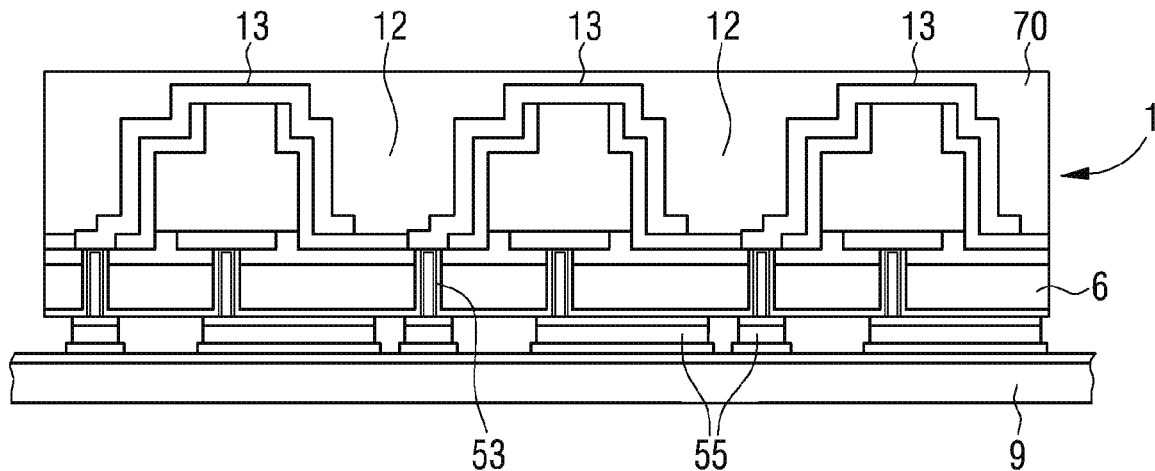

In the exemplary embodiment of FIG. 5, several of the emitter units 13 are monolithically integrated in the filling layer and on the continuous carrier 6. The semiconductor component 1 thus comprises several of the emitter units 13. The individual emitter units 13 can be contacted electrically independently of one another via the vias 53 and the contact areas 55. Between adjacent emitter units 11 are the gaps 12, which are filled with the filling material 70.

Figure 6:
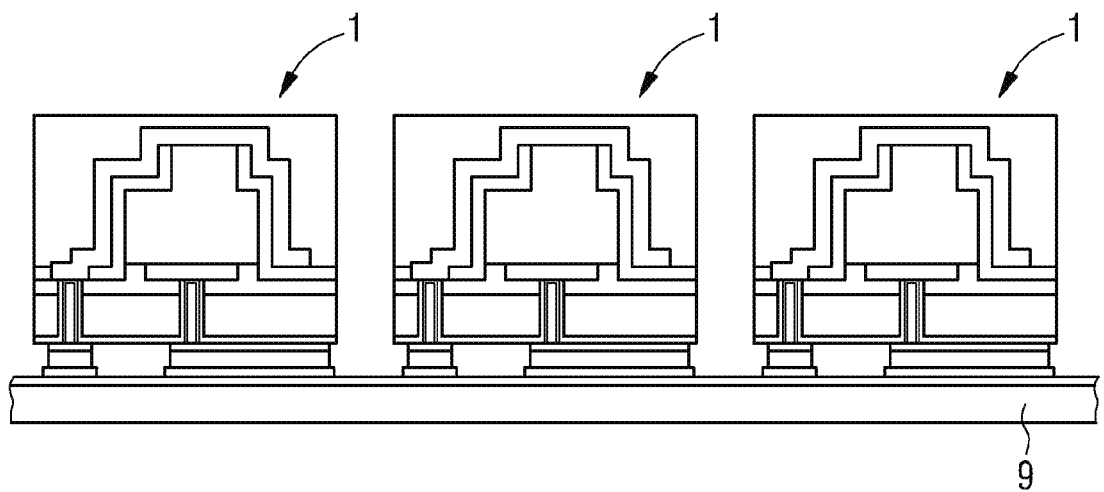

In contrast, in FIG. 6, several of the semiconductor components 1, as shown in FIG. 3, are individually and in a space saving manner mounted on the mounting platform 9.

Figure 7:
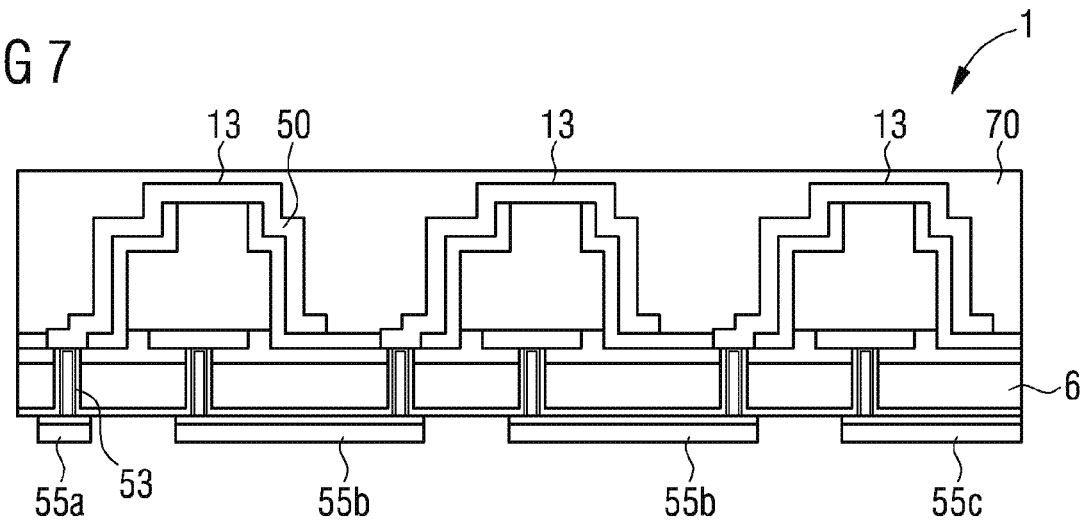
Figure 8:
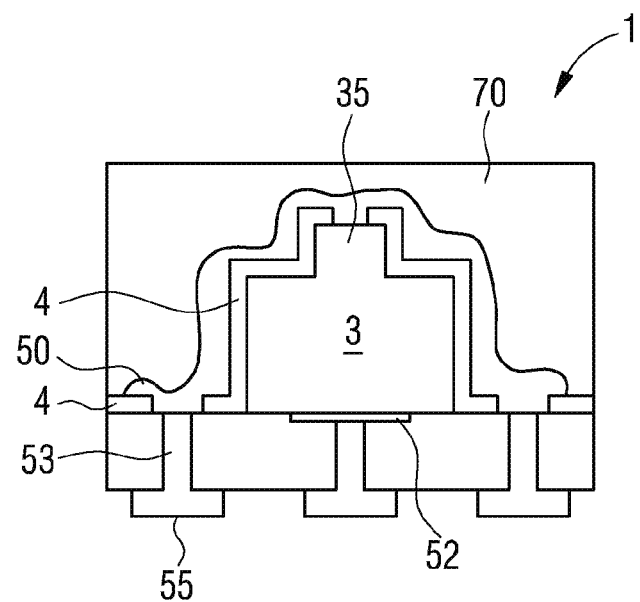
Figure 8:
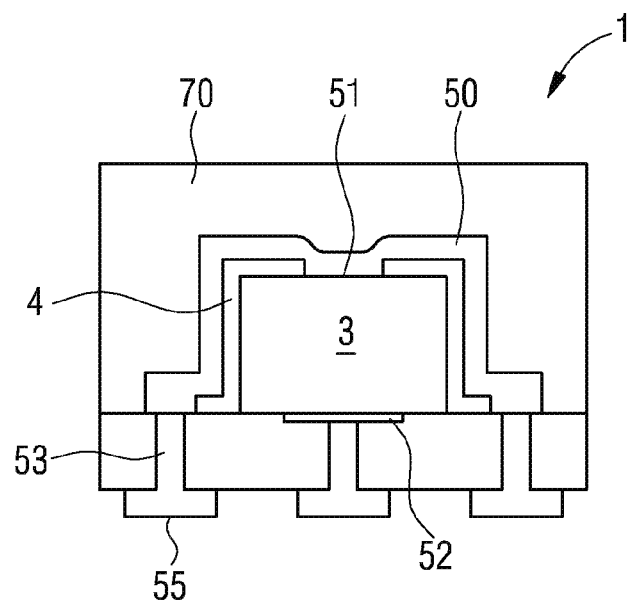

FIG. 7 illustrates that the emitter units 13 are electrically connected in series via contact pads 55b, which extend between adjacent emitter units 13. Anode contacts and cathode contacts are formed by the edge contact areas 55a, 55c.

In contrast, an electrical parallel connection can be achieved, for example, by ensuring that the metal layer 50 extends continuously over all emitter areas 13 and that the vias 53, 55 are designed accordingly.

In the previous exemplary embodiments, only one of the vias 53 is present along the emitter strands 11 per emitter unit 13, see also FIG. 1N. Furthermore, in the transverse direction, perpendicular to the emitter strings 11, there is also only one via 53 each for the underside contact 52 and the waveguide contact 51, so that as shown in FIG. 6 there are exactly two vias per emitter unit 13 in the transverse direction. This configuration is not mandatory. For example, there may be two vias per emitter unit 13 in the transverse direction for the metal layer 50, see FIG. 8A. The outer vias 53 and the metal layer 50 are preferably arranged symmetrically to the semiconductor layer sequence 3 with the strip waveguide 35.

In the previous exemplary embodiments, semiconductor component 1 is an edge-emitting ridge waveguide laser in each case. This is not absolutely necessary, see FIG. 8B. Thus the semiconductor component 1 can also be designed as a weekly guided laser without ridge waveguide.

The type of contacting shown in connection with FIGS. 8A and 8B can also be used accordingly in all other exemplary embodiments.

FIG. 9 illustrates various configurations for the vias 53 and the electrical contact areas 55. These configurations can be used in the same way for the exemplary embodiments in FIGS. 1 to 8.

As shown in FIG. 9A, there are several vias 53 along the resonator axes 37, i.e. along the emitter strands 11 and perpendicular to the facets 31. This applies to both contact areas 55.

In contrast, see FIG. 9B, the vias 53 are not approximately circular when viewed from above, but are elongated. In this case, for example, exactly one of the vias 53 is present per contact area 55, but it extends along the resonator axis 37 over the majority of the contact areas 55.

In FIG. 9C the contact area 55 for the waveguide contact 51 is divided into several subregions 56. The metal layer, not shown in FIG. 9C, can also be divided accordingly. For example, one of the vias 53 is present for each subregion 56. This allows the semiconductor layer sequence 3 along the resonator axis 37 to be controlled independently of each other in the subregions 56.

FIG. 9D illustrates a configuration of the contact areas 55 in particular for the case that there are several connections for the metal layer 50 in transverse direction, compare FIG. 8A or FIG. 8B. For example, the contact area 55 for the two outer vias 53 for the waveguide contact 51 is U-shaped or, in contrast to the illustration in FIG. 9D, is also frame-shaped. The inner contact area 55, for example for the underside contact 52, can be rectangular.

Unless otherwise indicated, the components shown in the figures follow each other, preferably in the order indicated. Layers not touching each other in the figures are preferably spaced apart. As far as lines are drawn parallel to each other, the corresponding areas are preferably also parallel to each other. Likewise, unless otherwise indicated, the relative positions of the drawn components to each other are correctly shown in the figures.

The invention described here is not restricted to the description based on the exemplary embodiments. Rather, the invention encompasses any new feature and also any combination of features, which in particular comprises any combination of features in the claims, even if this feature or this combination itself is not explicitly specified in the claims or exemplary embodiments.

This patent application claims the priority of the German patent application 10 2017 130 131.3, the disclosure content of which is hereby incorporated by reference.

LIST OF REFERENCES 1 optoelectronic semiconductor component
11 emitter strand
12 gap
13 emitter unit
2 growth substrate
22 etch stop layer
3 semiconductor layer sequence
30 side surface of the semiconductor layer sequence
31 facet
33 active zone
35 strip waveguide
37 resonator axis
4 passivation layer
50 metal layer
51 waveguide contact
52 underside contact
53 via
54 contact layer
55 electrical contact area
56 subregion
65 metallization
6 carrier
70 Filling layer
71 auxiliary carriers
73 planarization layer
74 electrical insulation layer
76 electrical insulation
77 first seed layer
78 filling
79 second seed layer
8 expansion foil
85 breaking blade
9 mounting platform
91 bond wire
D width
E protrusion
H height

The invention claimed is:

1. A method of manufacturing optoelectronic semiconductor components comprising the steps:

A) growing a semiconductor layer sequence for generating radiation onto a growth substrate, B) structuring the semiconductor layer sequence into emitter strands so that the semiconductor layer sequence is removed in gaps between adjacent emitter strands, C) applying a passivation layer, the semiconductor layer sequence at waveguide contacts remote from the growth substrate and the gaps remaining at least partially free, D) producing at least one metal layer, which extends from the waveguide contacts into the gaps, E) replacing the growth substrate with a carrier, F) making vias in the carrier so that the metal layer and underside contacts of the semiconductor layer sequence facing the carrier are electrically contacted, and removing the carrier between at least some of the emitter strands and between emitter units following one another along the emitter strands, and G) breaking the semiconductor layer sequence between the emitter units, so that facets are formed.

2. The method according to claim 1,
wherein
the semiconductor components are edge-emitting lasers
the passivation layer is applied directly to the semiconductor layer sequence and the metal layer is applied directly to the passivation layer, and
the metal layer reproduces the side surfaces of the emitter strands.

3. The method according to claim 1,
in which at least a part of the facets is configured for radiation extraction from the finished semiconductor components,
wherein the facets after step G) project beyond the associated carrier by at least 2 µm and by at most 50 µm.

4. The method according to claim 1,
in which, before step C), strip waveguides are produced at a side of the growth substrate remote from the semiconductor layer sequence, the strip waveguides being configured for one-dimensional radiation guiding in a direction parallel to the emitter strands,
wherein the waveguide contacts are each located at the associated strip waveguide.

5. The method according to claim 1,
in which a side of the semiconductor layer sequence remote from the growth substrate is planar in a region of a current feeding width of an active zone of the semiconductor layer sequence, so that the finished semiconductor components are gain-guided lasers.

6. The method according to claim 1,
where between steps D) and E)
a filling layer is produced which fills the gaps so that a side of the filling layer remote from the growth substrate is planar, and subsequently
an auxiliary carrier is attached to the filling layer.

7. The method according to claim 1 one of the previous claims,
in which an etch stop layer is produced between the semiconductor layer sequence and the growth substrate before or with step A),
wherein the etch stop layer is removed from the gaps in step B) and remaining residues of the etch stop layer are removed in step E) between detaching the growth substrate and attaching the carrier.

8. The method according to claim 7,
wherein, after removing the residues of the etch stop layer and before attaching the carrier
at least one contact layer is produced on each of the underside contacts, and
the contact layers are covered with a planarization layer.

9. The method according to claim 8,
wherein the carrier is directly and areally attached to the planarization layer by direct bonding and subsequently the auxiliary carrier is removed.

10. The method according to claim 1,
in which the metal layer extends on either side of the emitter strands from the respective waveguide contacts into the adjacent gaps, so that the emitter strands are symmetrically surrounded by the metal layer in the region of the semiconductor layer sequence as seen in cross-section.

11. The method according to claim 1,
in which exactly two of the vias are created per emitter unit in the direction perpendicular to the emitter strands.

12. The method according to claim 1,
in which three of the vias are created per emitter unit in the direction perpendicular to the emitter strands, the via for the underside contacts being located in each case centrally between the two vias for the waveguide contacts.

13. The method according to claim 1,
in which only one via is provided per emitter unit in the direction parallel to the emitter strands for each bottom contact and for each waveguide contact.

14. The method according to claim 1,
in which several of the vias are provided per emitter unit in the direction parallel to the emitter strands for each bottom contact and/or for each waveguide contact.

15. The method according to claim 14,
wherein along the emitter strands per emitter unit the metal layer and/or the
waveguide contacts are divided into a plurality of subregions which are electrically controllable independently of one another.

16. The method according to claim 1,
in which the metal layer extends along the emitter strands to at least 90% along the emitter units each.

17. The method according to claim 1,
in which the semiconductor layer sequence is based on InAlGaAs, the growth substrate is a GaAs substrate and the carrier is a silicon substrate.

18. The method according to claim 1,
in which several of the emitter units are electrically connected in series in a direction perpendicular to the emitter strands,
wherein only between emitter units connected in series the carrier remains between adjacent emitter strands in step F).

19. A surface-mountable optoelectronic semiconductor component comprising:
a carrier having a plurality of electrical vias therein,
a semiconductor layer sequence on the carrier with an active zone for generating radiation,
a passivation layer which completely covers side surfaces of the semiconductor layer sequence and which leaves a waveguide contact remote from the carrier at least partially free,
at least one metal layer extending from the waveguide contact to the carrier, wherein
the vias electrically contact the metal layer and an underside contact of the semiconductor layer sequence facing the carrier,
a facet of the semiconductor layer sequence for radiation extraction projects beyond the carrier, and
the metal layer reproduces the side surfaces so that an average distance between the metal layer and the semiconductor layer sequence is at most 1 µm.

* * * * *

UNITED STATES PATENT AND TRADEMARK OFFICE
CERTIFICATE OF CORRECTION

PATENT NO. : 11,127,877 B2
APPLICATION NO. : 16/772740
DATED : September 21, 2021
INVENTOR(S) : Muller Page 1 of 1

It is certified that error appears in the above-identified patent and that said Letters Patent is hereby corrected as shown below:

In the Claims

In Claim 7, Column 13, Lines 38-39, "one of the previous claims" should be deleted.

Signed and Sealed this
Twenty-first Day of December, 2021

Drew Hirshfeld
*Performing the Functions and Duties of the*
*Under Secretary of Commerce for Intellectual Property and*
*Director of the United States Patent and Trademark Office*